United States Patent
Lerdworatawee et al.

(10) Patent No.: US 7,564,388 B2
(45) Date of Patent: Jul. 21, 2009

(54) POWER EFFICIENT EQUALIZER DESIGN

(75) Inventors: Jongrit Lerdworatawee, Austin, TX (US); Mehmet Fatih Erden, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/637,643

(22) Filed: Dec. 12, 2006

(65) Prior Publication Data

US 2008/0136692 A1    Jun. 12, 2008

(51) Int. Cl.
*H03M 3/00* (2006.01)
(52) U.S. Cl. .................................. 341/143; 341/155
(58) Field of Classification Search .............. 341/155, 341/143, 61, 144
See application file for complete search history.

(56) References Cited

U.S. PATENT DOCUMENTS

| | | | | |
|---|---|---|---|---|
| 5,745,523 | A | 4/1998 | Dent et al. | 375/216 |
| 5,789,689 | A | 8/1998 | Doidic et al. | 84/603 |
| 5,999,573 | A * | 12/1999 | Zangi | 375/316 |
| 6,353,644 | B1 * | 3/2002 | Cai et al. | 375/350 |
| 6,693,576 | B2 * | 2/2004 | Azinger | 341/155 |
| 6,738,205 | B1 | 5/2004 | Moran et al. | 360/17 |
| 6,788,236 | B2 | 9/2004 | Erdogan et al. | 341/155 |
| 6,831,900 | B2 | 12/2004 | Blake | 370/289 |
| 6,876,699 | B1 | 4/2005 | Chadha et al. | 375/233 |
| 6,894,989 | B1 | 5/2005 | Chadha et al. | 370/289 |
| 6,970,511 | B1 | 11/2005 | Barnette | 375/240.21 |
| 6,973,146 | B1 | 12/2005 | Barnette et al. | 375/355 |
| 6,983,047 | B1 | 1/2006 | Chadha et al. | 379/406.01 |
| 6,993,099 | B2 | 1/2006 | Zogakis et al. | 375/340 |
| 7,076,514 | B2 | 7/2006 | Erdogan et al. | 708/323 |
| 7,142,606 | B2 * | 11/2006 | Talwalkar et al. | 375/259 |
| 7,236,110 | B2 * | 6/2007 | Antonesei | 341/61 |
| 2006/0234655 | A1 * | 10/2006 | Ikedo | 455/127.1 |
| 2007/0060077 | A1 * | 3/2007 | Qian | 455/130 |

* cited by examiner

*Primary Examiner*—Peguy JeanPierre
(74) *Attorney, Agent, or Firm*—David D. Brush; Westman, Champlin & Kelly P.A.

(57) ABSTRACT

A method of reading data is provided. The method includes receiving an analog signal, converting the analog signal to a one bit wide digital signal at a first sampling frequency, and downsampling the digital signal to provide the one bit wide digital signal at a second sampling frequency. The method further includes conditioning the digital signal prior to providing the digital signal to the detector. The conditioning can be performed after downsampling the digital signal. A data communication channel is also provided. The data communication channel includes an analog to digital converter configured to provide a first one bit wide digital data stream at a first sampling frequency and a signal conditioning member configured to accept the first one bit wide digital data stream at a first sampling frequency and provide a second one bit wide digital data stream at a second sampling frequency.

14 Claims, 10 Drawing Sheets

POWER EFFICIENT EQUALIZER DESIGN

FIELD OF THE DISCLOSURE

The present disclosure relates generally to data channels, and more particularly but not by limitation to power efficient signal conditioning of data received in a data communication channel.

BACKGROUND

In data storage systems, digital data are written to and read from data storage surfaces. One well-known type of data storage system is a disk drive, which reads and writes information along concentric tracks formed on disks. Another type of data storage system is known as a probe storage system, which reads and writes information from and to a data storage medium made of, for example, a ferroelectric material, although other materials may be used. Probe storage systems have a greatly increased capacity for data storage (currently up to 1 $Tb/in^2$). In order to meet high data rate requirements, an array of probe tips are used to read and write data from and to the data storage medium simultaneously. Although this approach is cost efficient, such designs result in increased power consumption, especially in the analog signal conditioning circuitry. As power consumption is a design constraint that can limit the capacity and speed of a probe storage system, it is desirable to minimize the amount of power consumed by probe storage system circuitry.

Thus, there is a need for data storage systems and methods that have circuitry designed with reduced power requirements to allow for improved capacity within the data storage systems.

SUMMARY

The present invention relates to data storage systems that include power efficient equalizer designs for probe storage systems, which address the above-mentioned need.

In one aspect of the invention, a method is provided. The method includes the steps of receiving an analog signal from a data channel and converting the analog signal to a one bit wide digital signal at a first sampling frequency. The method further includes downsampling the digital signal to provide downsampled digital signal at a second sampling frequency. The second sampling frequency is lower than the first sampling frequency.

In another aspect of the invention, a data communication channel is provided. The data communication channel includes an analog to digital converter configured to provide a one bit wide digital data stream at a first sampling frequency. The data communication channel further includes a signal conditioning member configured to accept the one bit wide digital data stream at a first sampling frequency and provide a downsampled digital data stream at a second sampling frequency.

In yet another aspect of the invention, the data communication channel can have a plurality of subchannels, with each subchannel including a downsampler and a filter element. The downsampler is configured to receive the one bit wide first digital data stream as an input from the analog to digital converter and provide the downsampled digital data stream as an output. The filter element is in electrical communication with the downsampler to receive and filter the second digital data stream.

In still another embodiment, a data storage system is provided. The system includes a data storage medium, at least one head configured to read data from the data storage medium, and a data communication channel configured to receive a signal from the at least one head. The data communication channel provides an output of a one-bit digital data stream at a first sampling frequency. The data communication channel includes an analog to digital converter that provides an output including a one-bit digital data stream at a second sampling frequency.

In another aspect of the embodiment, the data storage system can further include at least one downsampler. The downsampler is configured to receive data at the second sampling frequency and provide an output at the first sampling frequency. The data storage system can also include a plurality of filter members. Each of the plurality of filter members is configured to receive at least a portion of the output from the analog to digital converter. A summation device sums the outputs of the filter members.

These and other features and benefits that may characterize embodiments of the present disclosure will be apparent upon reading the following detailed description and review of the associated drawings.

DETAILED DESCRIPTION OF ILLUSTRATIVE EMBODIMENTS

Figure 1:
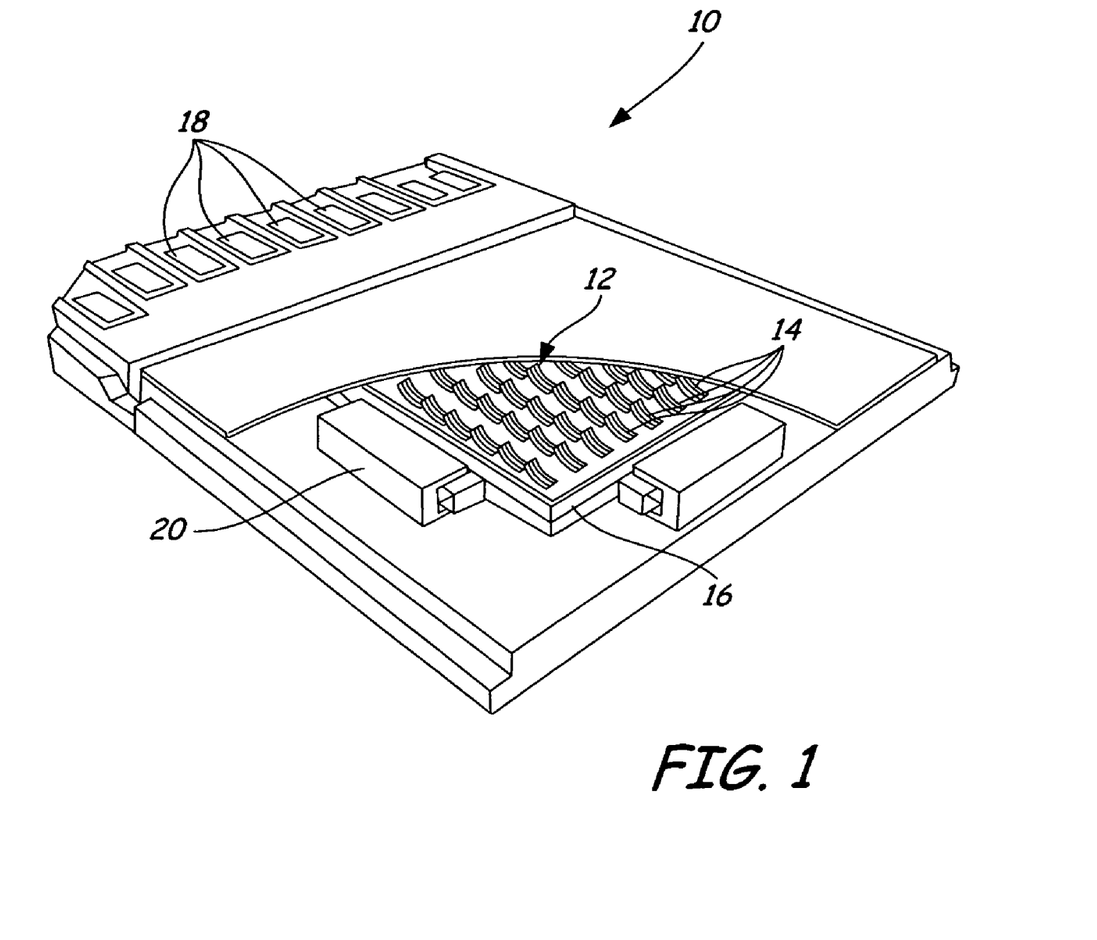
FIG. 1 illustrates a data storage system having a ferroelectric storage media that is scanned by an array of probe tips.

FIG. 1 illustrates an exemplary ferroelectric data storage device 10 in which one or more embodiments of the disclosure are useful. The data storage device 10 comprises a ferroelectric storage medium 16 with a scannable surface 12. An array of probes 14 contact the scannable surface 12 and communicate data to and from the scannable surface 12. Microactuators such as microactuator 20 provide relative scanning motion between the scannable surface 12 and the probes 14. Electrical contacts 18 provide connections between the device 10 and a host computer system (not shown). The connections between the device 10 and the host computer system include data communication channels, which, among other things, convert signals provided by either the host computer system or the array of probes into signals that the other of the host computer system or the array of probes can use.

The approach of employing probe storage using an array of probes to interact with a storage medium, although cost efficient for large amounts of data, results in increased power consumption in the data communication channel associated with each of the probes. It is preferable to provide a data communication channel that is power efficient, and this is especially true with respect to the analog circuitry that conditions the signal read by the read head. One of the most power hungry devices in the data communication channel is an analog-to-digital converter (ADC), which converts the analog data read by the probe into a digital signal suitable for use by, for example, a host computer. For the purposes of this application, the ADC is considered to be part of the analog portion of the channel.

Figure 2:
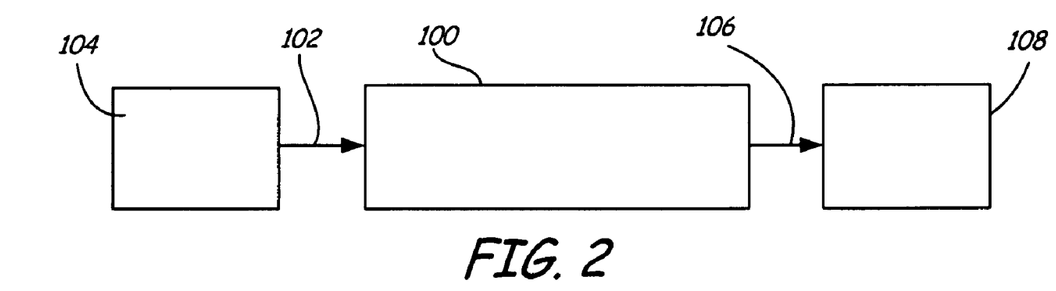
FIG. 2 is a schematic block diagram of a data communication channel incorporating a sigma-delta analog to digital converter configured to handle a signal provided by a source such as a probe storage device in accordance with an illustrative embodiment.

FIG. 2 is a block diagram of a data communication channel 100 according to one illustrative embodiment. Data communication channel 100 receives an input signal 102 from a source 104 and provides an output signal 106 to a target 108. The source can include any type of device configured to provide or receive data including, without limitation, a probe storage device, a disk drive, a wired or wireless data network, a cellular network, and a satellite network. The data communication channel 100 manipulates the input signal 102 to convert it into a form that is suitable as an input to the target 108. The illustrative embodiments of data communication channels such as data communication channel 100, discussed in more detail below, employ a sigma-delta ADC that oversamples the read head. However, other types of ADC circuits can be used in alternative embodiments. By oversampling, it is meant that the sigma-delta ADC takes more than one reading per bit of data read at the source 104, where one reading per bit of data read is the Baud rate. The sigma-delta ADC has just a single-bit comparator to perform the analog to digital conversion, thereby reducing the amount of power consumed by multi-channel ADCs. In addition, by oversampling the data received by the data probe at the ADC, it is possible to relax other requirements placed on analog circuitry. For example, it is possible to use an analog low pass filter with very low order to avoid an aliasing effect, while sharper cutoff transition can be obtained by using a high order digital filter in the succeeding stage. This results in significant reduction in hardware complexity.

Figure 3:
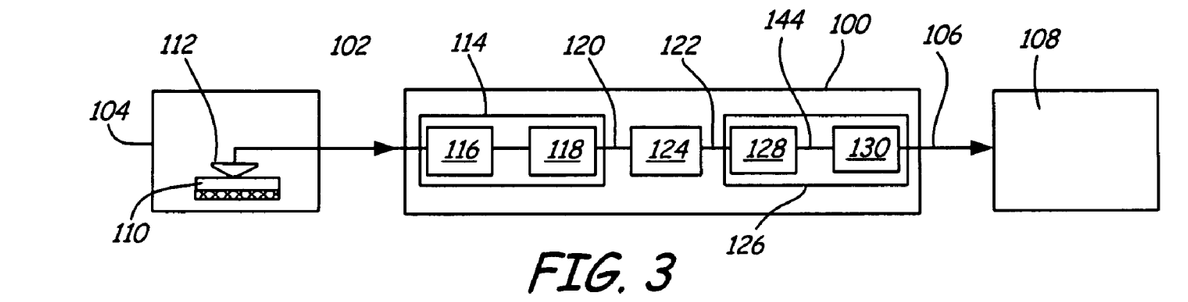
FIG. 3 is a detailed schematic block diagram of the data communication channel of FIG. 2.

In the more detailed diagram of the illustrative embodiment of data communication channel 100 shown in FIG. 3, the source 104 includes a data storage medium 110. A data read head 112 such as a probe is provided that interfaces with the data storage medium 110. Data read head 112, when it reads data from the data storage medium 110 provides an analog input signal 102, which represents data stored on the data storage device 110 and read by the data read head 112, to the data communication channel 100. The analog input signal 102 is conditioned by sending the analog input signal 102 through a signal conditioner 114, which, in one embodiment, includes a pre-amplifier 116 and a continuous time filter 118.

A conditioned signal 120, output from the signal conditioner 114, is then converted into a one bit wide digital signal 122 by ADC 124. For the purposes of this specification, the phrase one bit wide digital signal means that the output of the ADC has a single channel. Therefore, although during operation of the ADC, a stream of data bits will be produced by the ADC, all of the bits will be produced in a single channel in a serial pattern. The digital signal 122 is then further conditioned by signal conditioner 126, which, in this illustrative embodiment, includes a decimation filter 128 and an equalizer 130. The output signal 106 from the data communication channel 100 is then sent to the target 108, which, in this illustrative embodiment, is a data detector. The data detector can perform various functions, such as a Viterbi detection algorithm, decoding, and error detection and correction.

In the illustrative embodiment, the ADC 124 is a sigma-delta modulator that provides a single bit output. The ADC 124 is designed to oversample input signal 102. In the illustrative embodiment, the ADC 124 samples the conditioned signal M times and provides M digital bits of data (M being the oversample multiplier) for every bit of data read by the data read head 112. In one embodiment, M=16, although any number of samples can be taken per bit of data read by data read head 112.

Figure 4:
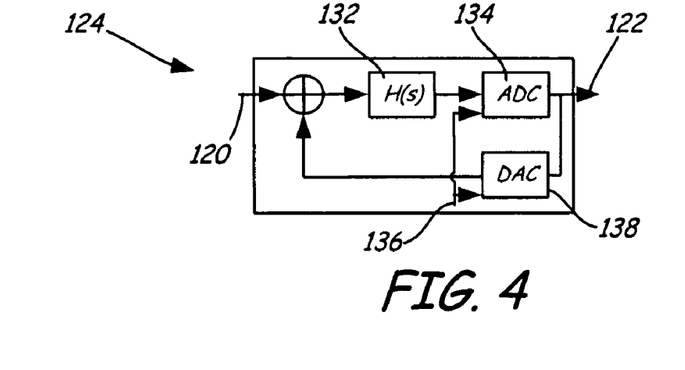
FIG. 4 is a detailed block diagram of the sigma-delta analog to digital converter configured for use in the data communication channel of FIG. 3.

FIG. 4 illustrates the sigma-delta modulator ADC 124 in greater detail. Conditioned analog signal 120 is inputted into a filter 132 with a transfer function denoted as H(s). The analog signal is then converted into a digital signal by a single bit ADC channel 134. A clock 136 determines the frequency at which conversions are made by the ADC channel 134. The digital signal is fed back to the input of the filter 132, first being converted back to an analog signal through a single-bit digital-to-analog converter (DAC) 138, which is also controlled by clock 136. This feedback signal and is summed with the conditioned analog signal 120 to reduce the effect of quantization noise. In the illustrative embodiment, the filter 132 has a transfer function H(s) that shapes the quantization noise generated by the ADC out of the signal band so that the quantization noise can be easily filtered out in a later step.

Figure 5:
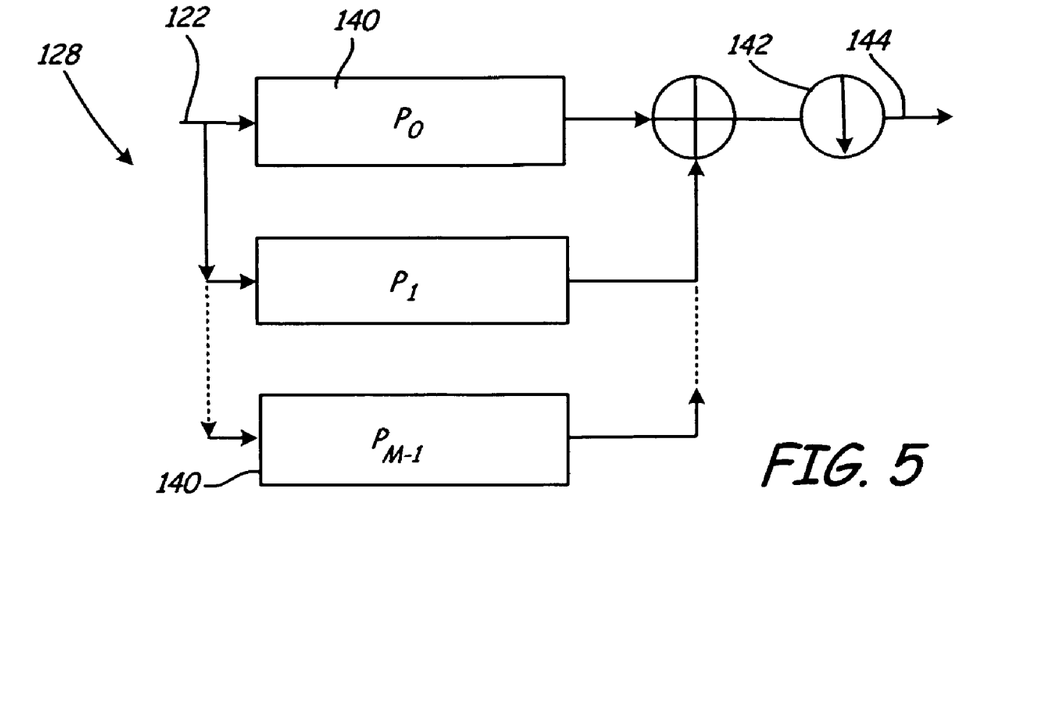
FIG. 5 is a diagram illustrating a decimation filter for use in the data communication channel of FIG. 3.

FIG. 5 provides a more detailed diagram of an illustrative embodiment of the decimation filter 128. Decimation filter 128 includes M filters 140 (labeled as $P_0 \ldots P_{M-1}$, where for example, M=16), each of which is configured to accept the digital signal 122. Each of the filters 140 is adapted to filter the digital signal 122 to reduce the effects of out of band noise. As discussed above, the filter 132 of the ADC 124 is designed to shape the quantization noise out of the signal band. Thus, the filters 140 act to reduce the quantization noise by filtering the out of band signal. The outputs of each of the filters are then summed together and provided to a downsampler 142. As discussed above, the ADC 124 over samples the analog input 120 by M times. The down sampler 142, in the illustrative embodiment, samples 1/M of the inputs provided to it and sends that selected sample 144 to the equalizer 130, which provides further signal conditioning and provides an output signal 106 to the target 108. Equalizer 130 is designed to minimize the effect of the intersymbol interference (ISI) and the in-band noise. Both the decimation filter 128 and the equalizer 130 provide signal conditioning that makes a detection scheme such as the Viterbi algorithm efficient.

Figure 6:
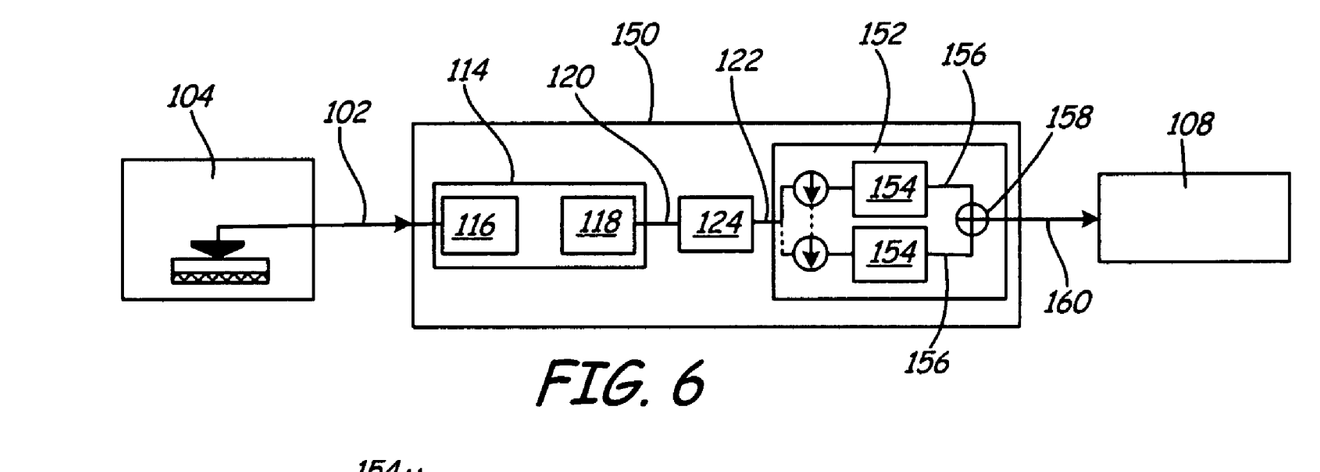
FIG. 6 is a schematic block diagram of a data communication channel incorporating a filterbank having a plurality of filter elements in parallel, each configured to receive data from a sigma-delta analog to digital converter in accordance with an illustrative embodiment.

Referring to FIG. 6, a block diagram of another illustrative embodiment of a data communication channel 150 is shown. Data communication channel 150 receives an input signal 102 from source 104. The analog input signal 102 is conditioned by sending the analog input signal 102 through a signal conditioner 114 to produce a conditioned analog signal 120. The conditioned analog signal 120 is then converted into a digital signal 122 by the ADC 124. The digital signal 122 is then further conditioned by signal conditioner 152, which, in the illustrative embodiment includes a plurality of filter members 154. The output signals 156 from each of the filter members 154 are then summed together with a summation element 158 to provide digital output signal 160 to the target 108.

Figure 7:
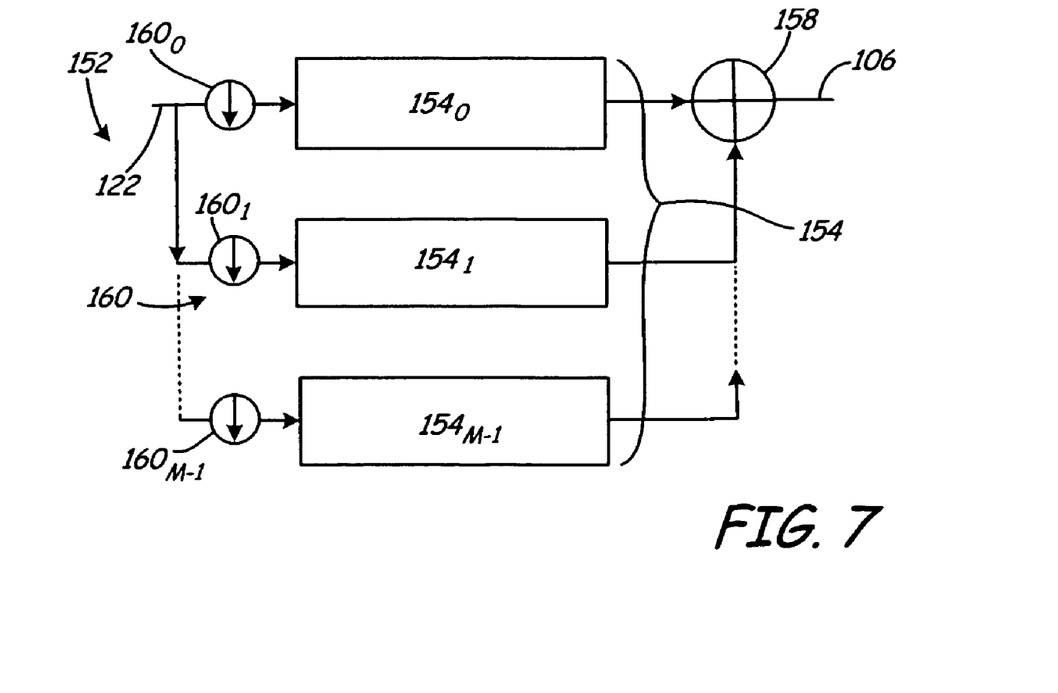
FIG. 7 is a diagram illustrating the filterbank of FIG. 6 having a plurality of filters arranged in parallel with each of the filters having a dedicated downsampler buffering data between an input of the filterbank and the plurality of filters.

FIG. 7 illustrates the signal conditioner 152 in greater detail. Signal conditioner 152 receives digital signal 122 from the ADC 124. The digital signal 122 is provided as M parallel single-bit sequences, where M, as discussed above, is the over sampling multiplier of the ADC 124, to a bank of M buffers 160$_0$ to 160$_{M-1}$ (collectively buffers 160). Buffers 160 are loaded with data sequentially, with each of the M buffers 160 having data provided by one of M consecutive samples by the ADC 124. When each of the buffers 160$_0$ to 160$_{M-1}$ have been filled with data, the data from all of the buffers 160 are clocked into a filterbank 154, which includes filters 154$_0$ to 154$_{M-1}$ and are simultaneously conditioned. The outputs of the filters 154$_0$ to 154$_{M-1}$ are then summed at summation element 158 to provide a single digital output signal 106 for the target 108. Because the filterbank 154 only receives data once every M samples provided by the ADC 124, the filterbank 154 is thus effectively required to filter only 1/M samples, thereby reducing the power used by the filterbank 154 by a factor of M.

Figure 8:
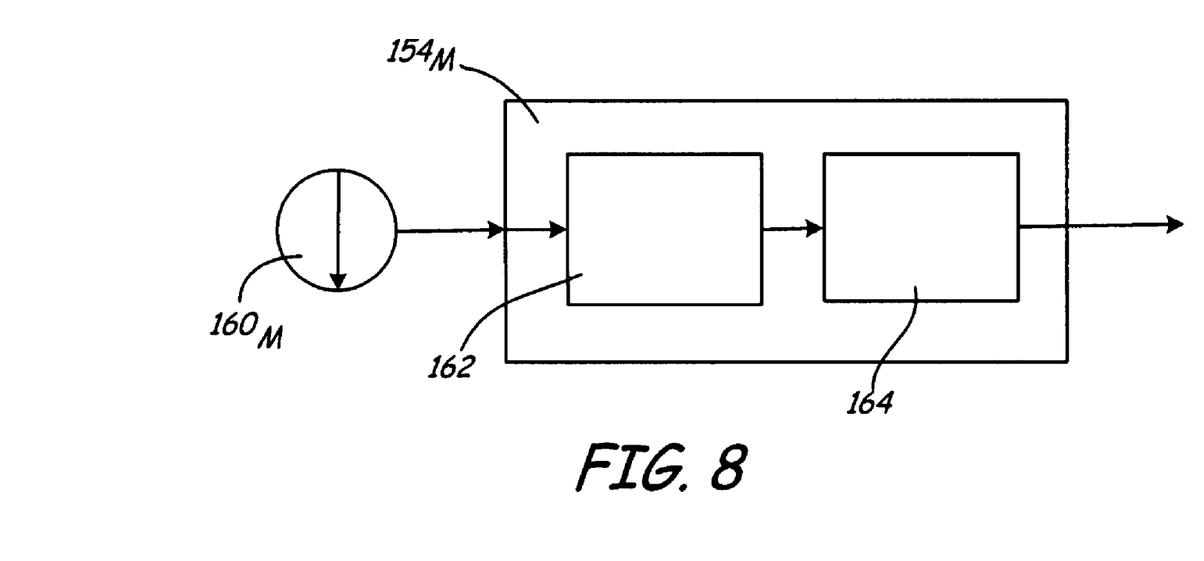
FIG. 8 illustrates one of the plurality of filters of the filterbank of FIG. 7 having a decimation filter and an equalizer integrated therein.

FIG. 8 illustrates an individual filter element 154$_M$ of filterbank 154 in greater detail. Filter element 154$_M$ includes both decimation filter 162 and equalizer 164. In the other embodiments of a data communication channel, a downsampler was positioned between the decimation filter and the equalizer. Now, however, the downsampler (buffer 160$_M$) is positioned before the filterbank 154. Thus, the filters 154$_M$ can be designed to perform the function of both the decimation filter 162 and the equalizer 164. While shown as separate elements in FIG. 8, the decimation filter 162 and the equalizer 164 can be integrated into a single signal-conditioning element. Thus, it may be said that the data communication channel 150 has a filterbank 154 with a plurality of filters 154$_0$ to 154$_{M-1}$, each of which has an integral decimation filter and equalizer. Alternatively, it may be said that data communication channel 150 has a filterbank 154 with a plurality of filters 154$_0$ to 154$_{M-1}$, each of which has an equalizer that conditions both the inband and out of band portions of the input signal.

1. Mathematical Descriptions of the Decimation and Equalizer Filters

As described above, the functions of the decimation filter and the equalizer elements are helpful to detection schemes. Below is a mathematical description of the decimation and equalizer filter elements of the illustrative embodiments. However, other transfer functions can be used in alternative embodiments. A decimation filter of illustrative embodiments, designed to filter one of the M outputs (or M outputs consecutively), can be represented with the following transfer function in the Z domain:

$$P(z) = \sum_n p(n)z^{-n}.$$

Collectively, then, the decimation filters 128 of data communication channel 100 when summed together, can be represented as $$P(z) = \sum_{m=0}^{M-1} z^{-m} P_m(z^M),$$

where $$P_m(z) = \sum_n p_m(n)z^{-n}$$

denotes the mth polyphase component of P(z), i.e., $p_m(n)=p(nM+m)$ for m={0,1, . . . , M−1}.

In the data communication channel 150, as described above, buffers 160 are positioned in front of the decimation filters 162 (which are represented here as $P_m(z)$). In addition, as described above, the decimation filter 162 or the function denoted as the decimation filter 162 is just a portion of the function provided the filter bank 154. Each of the filters 154$_M$, also includes an equalizer 164. Filters 154$_0$ to 154$_{M-1}$ are represented here as $F_m(z)$. $F_m(z)$ represents a combination of the decimation and equalizer functions. Filter bank 154 is optimally designed so that the channel response at the output of the sum of the filters 154$_0$ to 154$_{M-1}$ is close (that is, it has a minimum means square error) to the desired output. Specifically, the mean square error (MSE) is defined as $$MSE = E\left\{\left|\hat{g}^T a - \sum_{m=0}^{M-1} \hat{f}_m^T y_m\right|^2\right\},$$

where $\hat{g}$ (with $\hat{g}=[g_0, \ldots, g_L]^T$) is the coefficient vector of the (L+1) tap target response G, $\hat{f}_m$ (with $\hat{f}_m=[\hat{f}_{m,-K}, \ldots, \hat{f}_{m,K}]^T$) is the coefficient vector of the mth equalizer $F_m$ with (2K+1) taps, $\bar{a}$ (with $\bar{a}=[\bar{a}_k, \ldots, \bar{a}_{k-L}]^T$) is the input sequence vector and $\bar{y}_m$ (where $\bar{y}_m=[\bar{y}((k+K)T+mT/M), \ldots, \bar{y}((k-K)T+mT/M)]^T$ and where T is the symbol time interval) is the one-bit sequence vector of the mth equalizer output. E{ } denotes the expectation operator.

Thus, the channel equalizer can be designed for a fixed target channel or a general target channel with monic constraint as summarized in the following. For a fixed target, that is for a given g, all $\hat{f}_m$ are obtained by first combining them into a new vector $\hat{f}$ (where $\hat{f}=[\hat{f}_0^T, \ldots, \hat{f}_{M-1}^T]^T$), and solving the following equation for $\hat{f}$:

$$\hat{f}=[E\{\bar{y}\bar{y}^T\}]^{-1}E\{\bar{y}a^T\}g.$$

For a general target with monic constraint, with a given L, where L is the number of taps, the coefficient vector of g becomes $g=[1,\tilde{g}]^T$, where $\tilde{g}=[g_1, \ldots, g_L]^T$. To obtain all $\hat{f}_m$ and $\tilde{g}$, we first combine them into a new vector $\tilde{f}=[f^T,-\tilde{g}^T]^T$, where $\hat{f}$ is the same as above) and solve the following equation for $\tilde{f}$. Thus, $$\tilde{f}=[E\{\tilde{y}\tilde{y}^T\}]^{-1}E\{\tilde{y}a_k\},$$

where $\tilde{y}=[y^T,\tilde{a}^T]^T$ is the output vector, and where $\tilde{a}=[a_{k-1}, \ldots, a_{k-L}]^T$. Both the effect of the intersymbol interference and the quantization noise have been already accounted for in the formula of mean square error described above. Therefore, optimizing $\hat{f}_m$ and/or $\bar{g}$ to minimize the mean square error results in achieving the desired intersymbol interference with as little the quantization noise added as possible.

2. Robustness of the Illustrative Embodiments

Figure 9A:
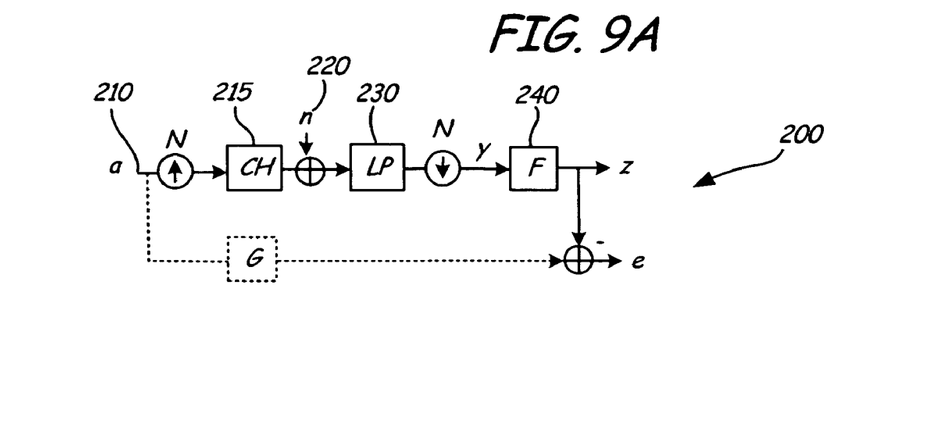
FIGS. 9A-9C are schematic block diagrams of models of data communication channels used to verify the designs of the data communication channels of the illustrative embodiments.
Figure 9B:
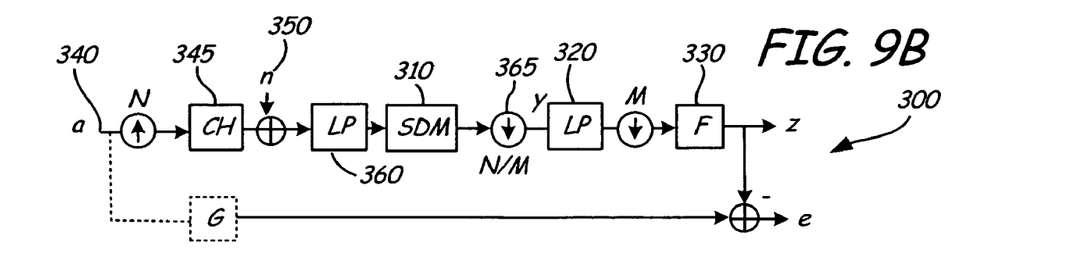
Figure 9C:
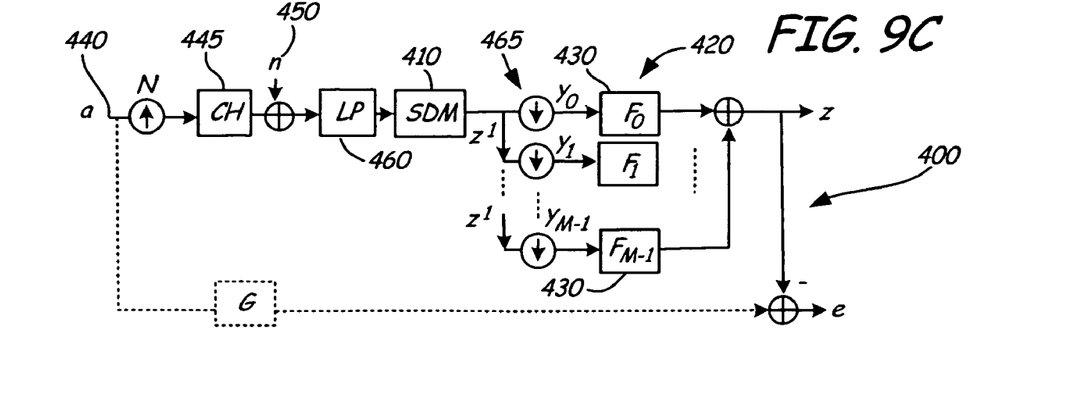

The illustrative embodiments described above have been modeled to determine their robustness with respect to noise sources such as media jitter and clock jitter. FIGS. 9A-9C illustrate three discrete-time models 200, 300, and 400, which approximate three different embodiments of analog data communication channels. Model 200 is a model of a data communication channel having a low pass filter 230 and an equalizer 240. The low pass filter 230 receives an input 210 (also represented as "a" in FIG. 9A), which is conditioned by element CH 215. CH 215 represents the combination of the data medium and the pre-amplifiers similar to those shown in source 104 and pre-amplifier 116 above. Once it passes through CH 215, input 210 is summed with a noise signal 220, which simulates noise in the system. The model 200 samples input 215 at a sampling frequency of N times the Baud rate, which is later downsampled between the lowpass filter 230 and the equalizer 240. The output z of the equalizer 240 is provided as the output signal of model 200. Input 210 is also provided to an element G, which is subtracted from the output z of the equalizer 240 to provide an error signal, e for model 200.

Model 300 illustrates a model of a data communication channel corresponding to data communication channel 100. Model 300 includes a models of a sigma-delta ADC 310, a decimation filter 320, and an equalizer 330. Input 340 (also represented as "a" in FIG. 9B) is sent through element CH 345, as above, and is subsequently summed with a noise signal 350. A low pass filter 360, which corresponds to the continuous time filter 118, is modeled to filter the input prior to introduction to the ADC 310. Downsampler 365 reduces the modeled signal to the sampling rate in the model 300 to that of the ADC 310. Downsampler 370 reduces the data rate to the Baud rate. The output z of the equalizer 330 is provided as the output signal of model 300. Input 340 is also provided to an element G, which is subtracted from the output z of the equalizer 330 to provide an error signal e for model 300.

Model 400 illustrates a model of a data communication channel corresponding to data communication channel 150. Model 400 includes a sigma-delta ADC 410 with a filterbank 420 having a plurality of equalizers 430 equal to the sampling rate M of the sigma-delta ADC 410. Each of the equalizers 430 has a downsampler 465 associated with it to reduce the data rate passed to the equalizer from M to the Baud rate. Equalizer 430 is modeled to provide the filtering and signal conditioning functions similar to that of both the decimation filter 320 and equalizer 330 in model 300. Input 440 (also represented as "a" in FIG. 9C) is sent through element CH 445, as above, and is subsequently summed with a noise signal 450. A low pass filter 460, which corresponds to the continuous time filter 118, is modeled to filter the input prior to introduction to the ADC 410. The output z of the equalizer 420 is provided as the output signal of model 400. Input 440 is also provided to an element G, which is subtracted from the output z of the equalizer 420 to provide an error signal e for model 400.

Figure 10:
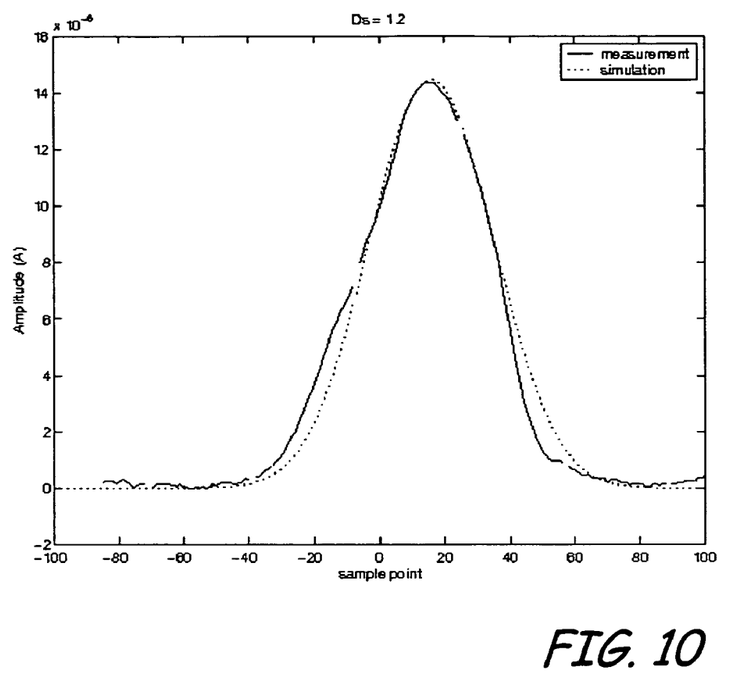
FIG. 10 is a chart illustrating the simulated input from a model analog signal conditioner as compared to the input from an analog signal conditioner of the illustrative embodiments.

The discrete-time models 200, 300, and 400 have a sampling frequency of N times of the Baud rate to approximate a continuous analog signal. To generate the readback signal from the CH element in each model 200, 300, and 400, the dibit response s(n) of the readback signal is approximated as:

$$s(n) = \frac{1}{2}\left(\frac{\pi}{2\ln 2}\right)^{1/4}\left[\text{erf}\left(\frac{2\sqrt{\ln 2}}{ND_s}n\right) - \text{erf}\left(\frac{2\sqrt{\ln 2}}{ND_s}(n-N)\right)\right]$$

where $D_s$ denotes the normalized density of the written data pattern on the storage medium. FIG. 10 illustrates input from the CH model as provided in each of models 200, 300, and 400 above as compared to actual data taken from a physical system designed using the model. The results show that the model for the readback signal shown above is valid as it closely approximates the actual data measured in a physical implementation.

Each of the models 200, 300, and 400 assume that the Viterbi algorithm is used for detection in all systems. Further, M is selected to be 16 and the noise transfer function (NTF), which defines the shapes of noise (such as the quantization noise) propagated to the signal condition element is assumed to be a third order highpass Butterworth filter with the corner frequency at ½M.

In model 300, the filter used for decimation is a third order Butterworth lowpass filter with cutoff-frequency at ½M. In physical representations such as that described in data communication channel 100, the decimation filter 128 is implemented using an FIR filter. To approximate the NTF in the model 300, a large number of taps, e.g., at least 500 taps are implemented in the FIR filter, using the Parks-McClellan algorithm. Equalizer 330, represented as F, is modeled in models 200 and 300 with 21 taps.

In model 400, the plurality of equalizers 430 in the filterbank 420 are represented individually as $F_m$. To analyze the performance tradeoff in model 400 between the bit error rate (BER) and power the number of taps for each $F_m$ is selected as 5 (or 80 in total) and 11 (or 176 in total), respectively.

Figure 11:
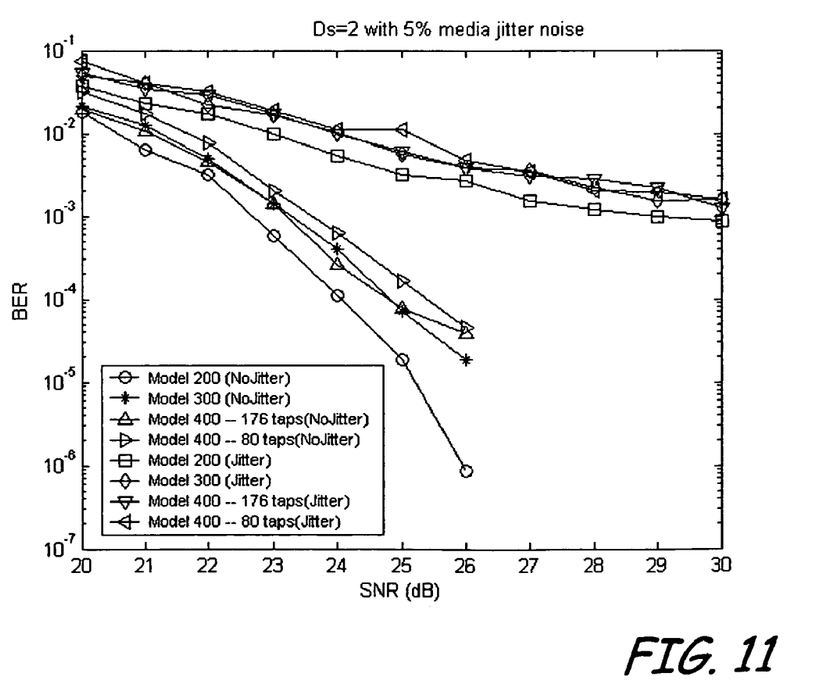
FIGS. 11-18 are charts illustrating the outputs from simulations of data communication channels of the illustrative embodiments in various noise and data density environments.
Figure 12:
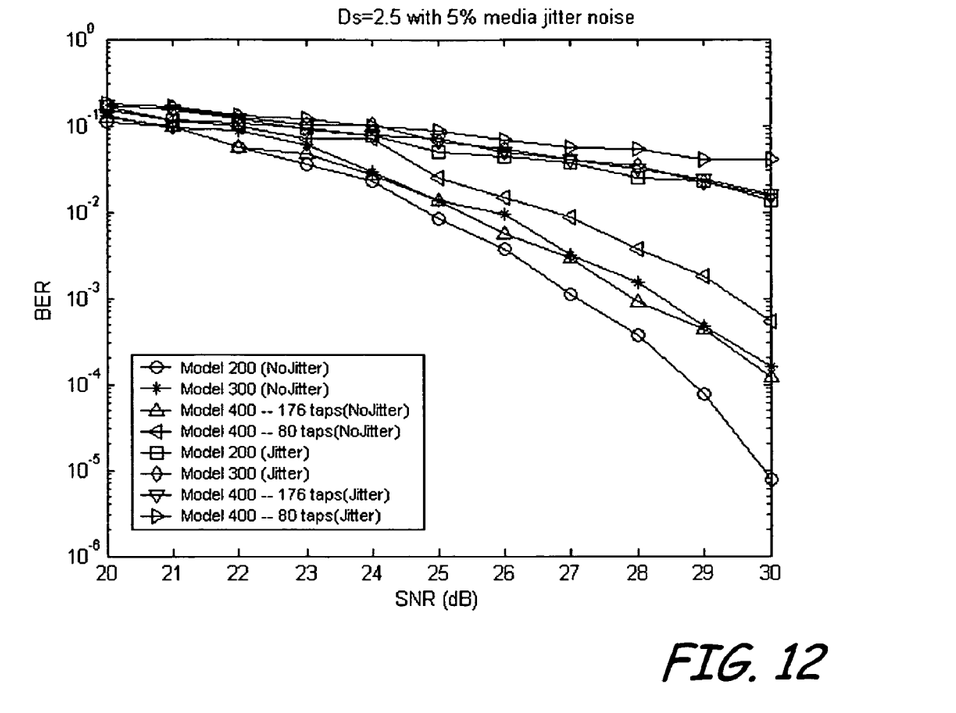
Figure 13:
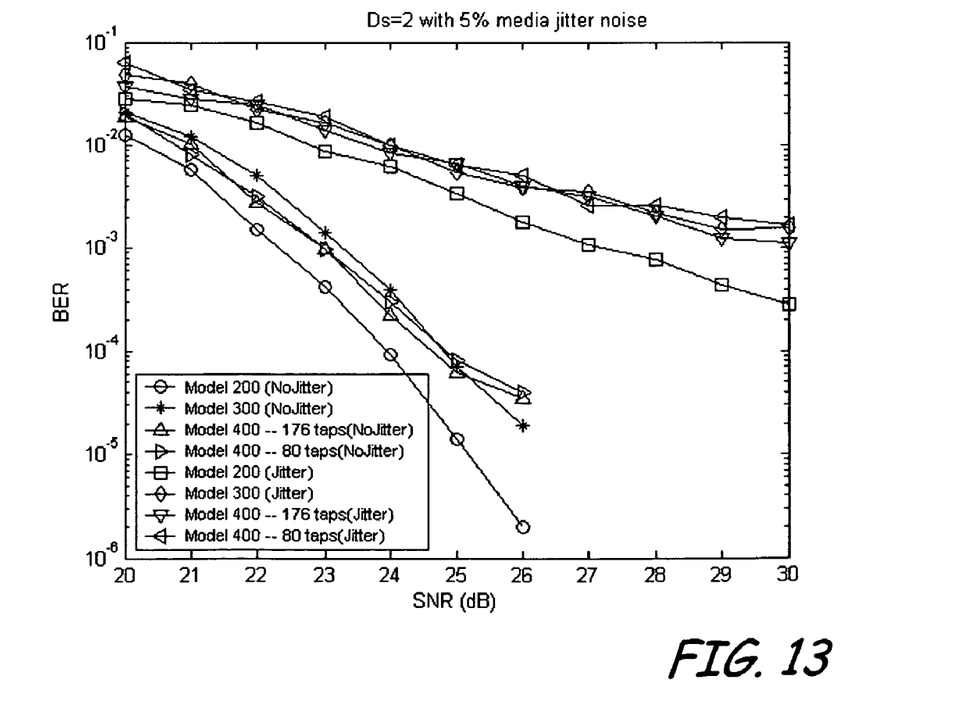
Figure 14:
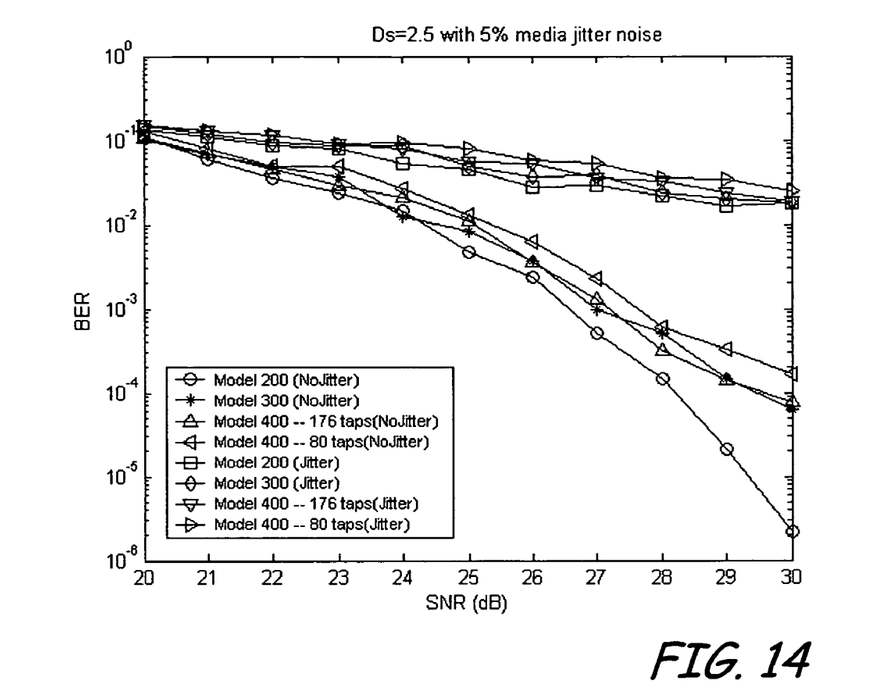

The performance results for the fixed target channel (i.e., $\bar{g}=[1,2,1]$) with $D_s=2$ and 2.5 with 5% media jitter noise introduced into the model are shown in FIGS. 11 and 12, respectively. Performance results for a general target channel with $D_s=2$ and 2.5 with 5% media jitter noise are shown in FIGS. 13 and 14. Media jitter noise is modeled as a random shift $\Delta_k$ in the transition with a truncated Gaussian probability distribution function. Thus, the range of $\Delta_k$ is limited to (−T/2,T/2). In this model, the mean is zero and the variance is 5% over the width of the dibit response at half of its peak value.

As is seen in FIGS. 11-14, the model 400 having a filterbank 420 with equalizers 430 having 176 taps collectively yields almost the same BER as the model 400 having a filterbank 420 with equalizers 430 with 80 taps. Further, models 300 and 400 exhibit only about a 1 dB loss in the signal-to-noise ratio (SNR) from that seen model 200 when the BER is targeted at $10^{-4}$ and there is no media jitter. With presence of the media jitter, the difference is smaller.

More importantly, the model 400 does not suffer a significant BER loss with a reduction in power realized by the lower number of taps and by downsampling prior to the filtering. When $D_s=2$, decimation filter 320 of model 300 is models as an FIR filter with 500 taps is used and model 400 has a filterbank 420 with 80 taps (where M=16 and the number of taps per equalizer 430 is 5). Compared with model 300, then, the amount of power can be reduced in the model 400 system by 100 times (500 taps is reduced to 80 taps and the filtering time is reduced by M times, that is, effectively only 1/M samples is filtered) with little or no degradation in BER. Specifically, as is shown in FIGS. 11-14, only a 0.5 dB greater signal-to-noise ratio is required to achieve BER of $10^{-4}$ with no media jitter added, while no significant loss in BER occurs with presence of media jitter noise. Similar performance results are observed for the general target design as shown in FIGS. 12 and 13 with $D_s=2$ and 2.5, respectively. As the density of data on the source media ($D_s$) increases, however, more power is required for better performance.

Figure 15:
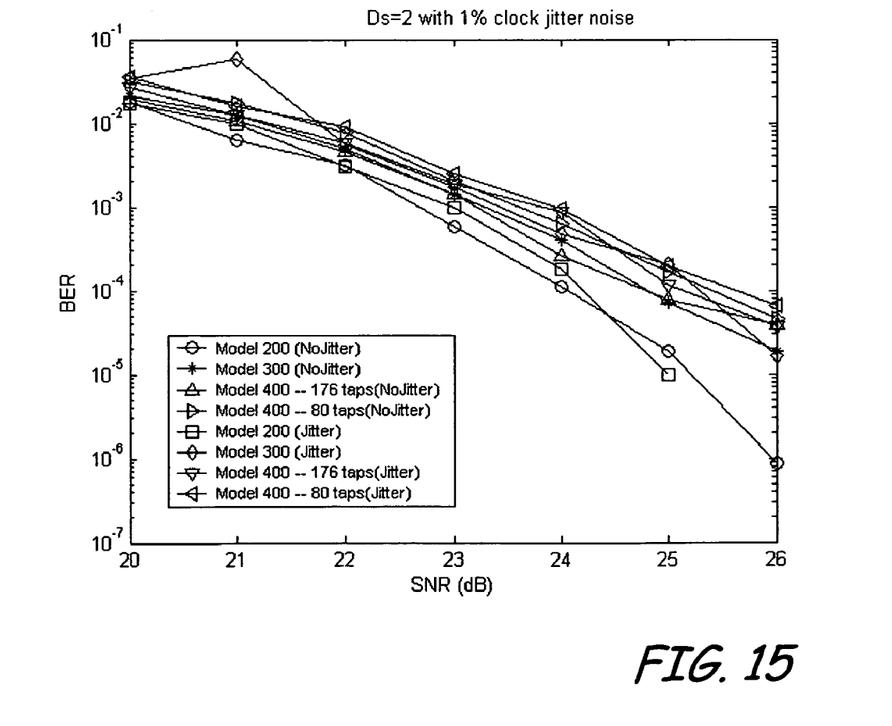
Figure 16:
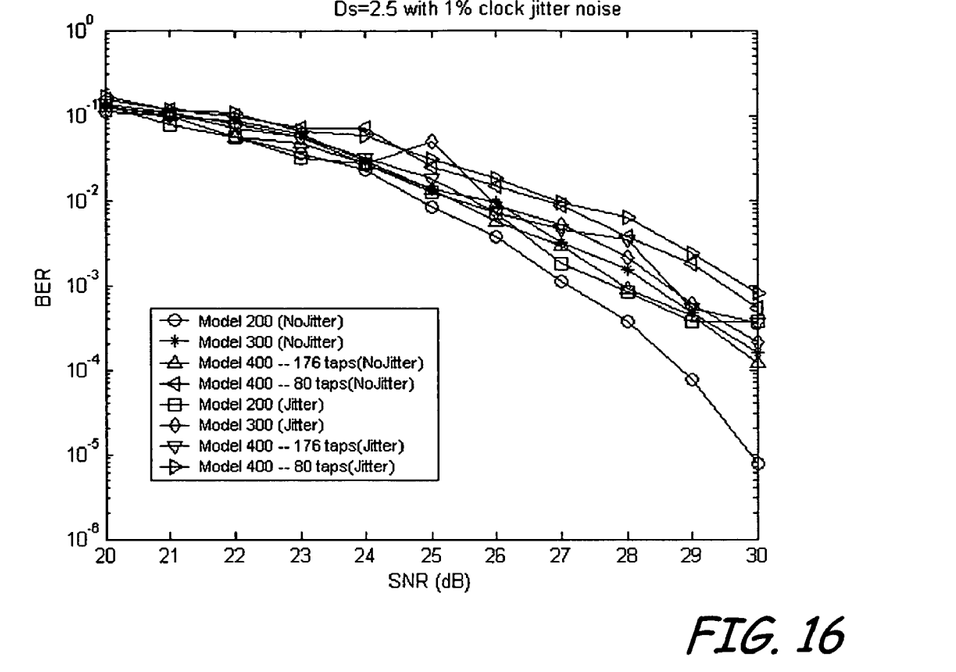
Figure 17:
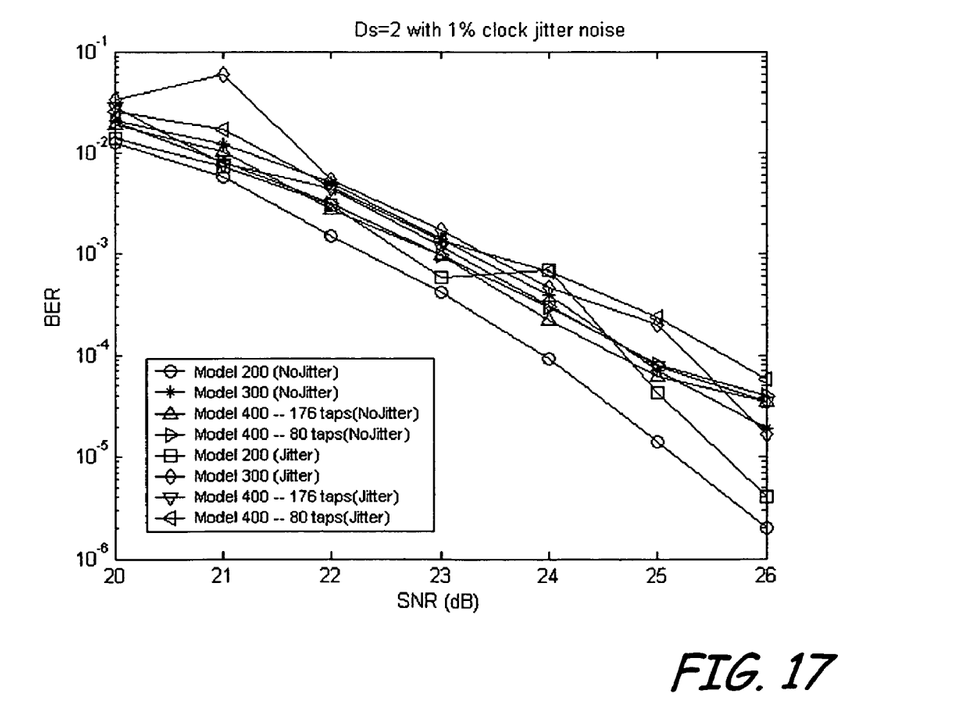
Figure 18:
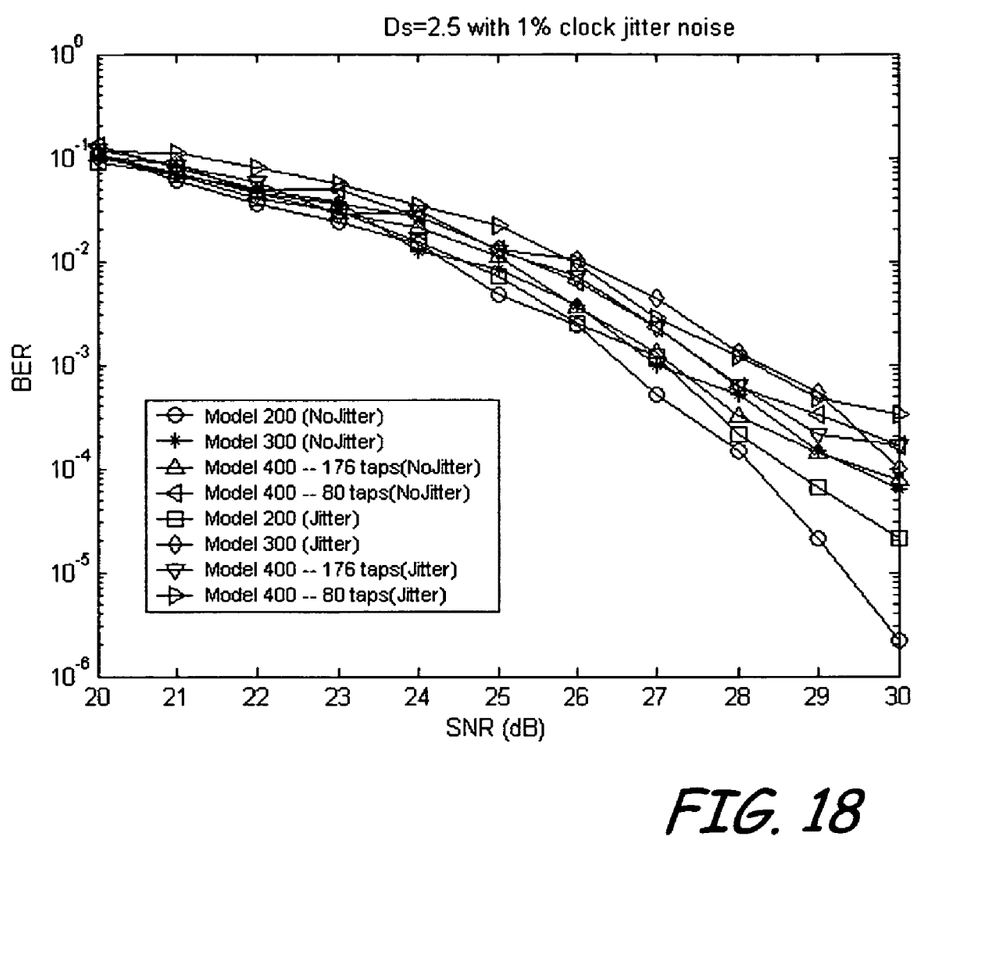

In addition, model 400 does not suffer from more degradation in performance than model 300 as a result of timing errors, otherwise known as clock jitter. FIGS. 15 and 16 show the BER results for the target channel with $D_s=2$ and 2.5, respectively when noise such as that caused by timing errors is introduced. Similar results are observed in FIG. 17 and 18 for the general target design with $D_s=2$ and 2.5, respectively. Thus, it is shown that the model 400 provides improved power consumption without appreciable loss in performance and with robustness with respect to noise.

In summary, the illustrative embodiments can provide for the following advantages. By incorporating a sigma-delta ADC into the data communication channel, significant reductions in power consumption and complexity can be achieved in the analog portion of the channel. In addition, the incorporation of an integrated filter, which includes the functionality of both a decimation filter and an equalizer, can allow for optimization not only of the intersymbol interference but also can remove the quantization noise. The structure required to implement the integrated filter is simple as there is no additional penalty to generate M parallel output sequences. The use of the integrated filter can reduce complexity, and can increase power efficiency, with no significant degradation in performance. The design is robust with respect to media noise and timing error for a target design. Thus, the data communication channels shown here in the illustrative embodiments are well suited for many data communication applications such as probe storage devices, which require high performance with low power requirements.

It is to be understood that even though numerous characteristics and advantages of the various embodiments have been set forth in the foregoing description, together with details of the structure and function of various embodiments, this disclosure is illustrative only, and changes may be made in detail, especially in matters of structure and arrangement of parts within the principles of the present embodiments to the full extent indicated by the broad general meaning of the terms in which the appended claims are expressed. For example, the particular elements may vary depending on the particular application for the communication system while maintaining substantially the same functionality without departing from the scope and spirit of the present embodiments. In addition, although the embodiments described herein is directed to data communication channel for a data storage system, it will be appreciated by those skilled in the art that the teachings of the present embodiments can be applied to other systems that use data communication channels, without departing from the scope and spirit of the present embodiments.

What is claimed is:

1. A method, comprising:
    converting an analog signal to a one bit wide digital signal at a first sampling frequency;
    providing a plurality of downsampling elements, each including a buffer, for downsampling the one bit wide digital data signal to a second sampling frequency, wherein the second sampling frequency is lower than the first sampling frequency;
    loading each of the buffers with a portion of a series of bits from the one bit wide data digital signal; and
    summing the outputs of the plurality of buffers to generate a downsampled digital data signal.

2. The method of claim 1 and further comprising:
    providing a plurality of conditioning elements for conditioning the downsampled digital signal, each in electrical communication with one of the downsampling elements; and
    presenting to each of the plurality of conditioning elements the portion of the series of one bit wide digital signals loaded into the buffer with which it is in electrical communication.

3. The method of claim 1 wherein the second sampling frequency is an integer multiple of the first sampling frequency and wherein the step of providing a plurality of downsampling elements includes providing a number of downsampling elements equal to the integer multiple.

4. The method of claim 1 and further comprising receiving the analog signal from a data channel.

5. The method of claim 1, wherein the digital signal is downsampled prior to being conditioned.

6. The method of claim 1, wherein converting an analog signal includes filtering the analog signal to shape quantization noise out of the signal band and further comprising conditioning the one bit wide digital signal to filter the out of signal band noise.

7. A data communication channel, comprising:
    an analog to digital converter configured to provide a one bit wide digital data stream at a first sampling frequency; and
    a signal conditioning member having a plurality of subchannels configured to accept the one bit wide digital data stream at a first sampling frequency and provide an output of a downsampled one bit wide digital data stream at a second sampling frequency wherein each subchannel includes:
        a downsampler configured to receive the one bit wide digital data stream as an input from the analog to digital converter and provide the downsampled digital data stream; and
        a filter element in electrical communication to receive the downsampled digital data stream from the downsampler; and
        a summation device, which sums the outputs of each of the subchannels together to generate the one bit wide digital data signal at the second sampling frequency.

8. The data communication channel of claim 7 wherein the filter element comprises:
    a decimation filter; and
    an equalizer.

9. The data communication channel of claim 8 wherein the downsampler is positioned to receive the one bit wide digital data stream after it has been filtered by the decimation filter.

10. A data storage device having an array of probes for reading data, wherein each of the array of probes is configured to provide data to one of a plurality of data communication channels of claim 7.

11. A data storage system, including:
    a data storage medium;
    at least one head configured to read data from the data storage medium; and
    a data communication channel configured to receive a signal from the at least one head and provide a one bit wide digital data stream at a first sampling frequency, the data communication channel including an analog to digital converter that provides an output including a one bit wide digital data stream at a second sampling frequency, a plurality of filter members, wherein each of the plurality of filter members is configured to receive at least a portion of the output from the analog to digital converter, and a summation device configured to receive the sum of the outputs of each of the filter members to generate the one bit wide digital data stream at the second frequency.

12. The data storage system of claim 11 wherein the data communication channel further comprises:
at least one downsampler, configured to receive data at the first sampling frequency and provide an output at the second sampling frequency.

13. The data storage system of claim 11, wherein the data communication channel further comprises:
a plurality of downsamplers, each configured to receive data at the first sampling frequency and provide an output at the second sampling frequency to one of the plurality of filter members.

14. The data storage system of claim 11 wherein each of the filter members is configured to filter electrical noise outside of a signal band and condition the signal within the signal band.

* * * * *